United States Patent [19]

Lascelles

[11] 4,230,925
[45] Oct. 28, 1980

[54] CIRCUIT BOARD WIRE BONDING AND CUTTING APPARATUS

[75] Inventor: Daniel J. Lascelles, De Land, Fla.

[73] Assignee: McDonnell Douglas Corporation, St. Louis, Mo.

[21] Appl. No.: 937,412

[22] Filed: Aug. 28, 1978

[51] Int. Cl.³ .............................................. B23K 11/16
[52] U.S. Cl. .................................. 219/56.1; 219/78.15; 219/91.23; 228/4.5; 228/5.1
[58] Field of Search ................. 219/56.1, 56.21, 56.22, 219/78.15, 103, 91.23; 228/4.5, 5.1

[56] References Cited

U.S. PATENT DOCUMENTS

| | | | |
|---|---|---|---|
| 2,339,884 | 1/1944 | Schlumpf | 219/103 X |
| 3,244,344 | 4/1966 | Folk | 228/4.5 |
| 3,342,972 | 9/1967 | Penberg | 219/56.1 |
| 3,538,292 | 3/1967 | Helms | 219/56.1 |
| 3,648,354 | 3/1972 | Mashino | 228/5.1 X |

*Primary Examiner*—E. A. Goldberg
*Attorney, Agent, or Firm*—Gravely, Lieder & Woodruff

[57] ABSTRACT

Apparatus for weld bonding circuit connection wires to stitch pins in a printed circuit board, including a bonding head which combines an omni-directional cutter in association with an electrode which the circuit wire extends, and structure is provided to bend the exposed end of the wire before welding to a stitch pin.

12 Claims, 9 Drawing Figures

U.S. Patent   Oct. 28, 1980   Sheet 1 of 3   4,230,925
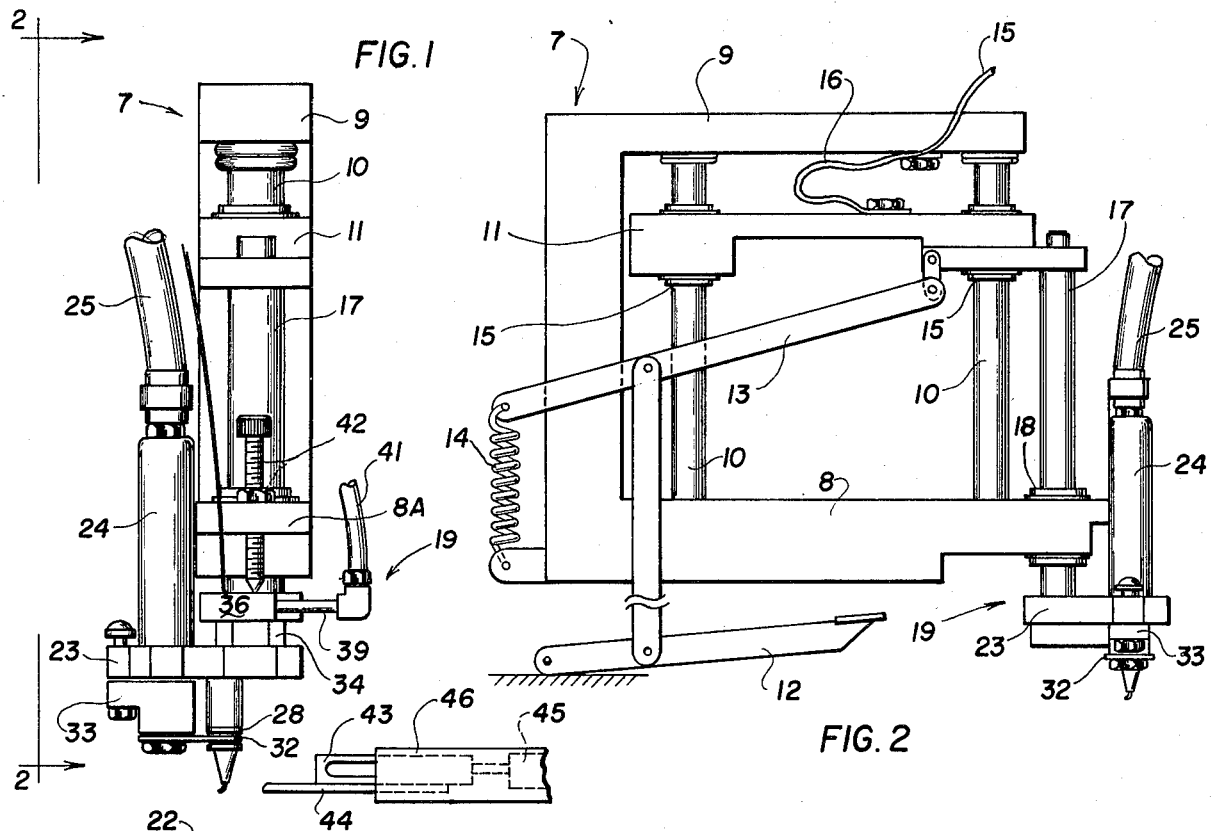
FIG. 1
FIG. 2
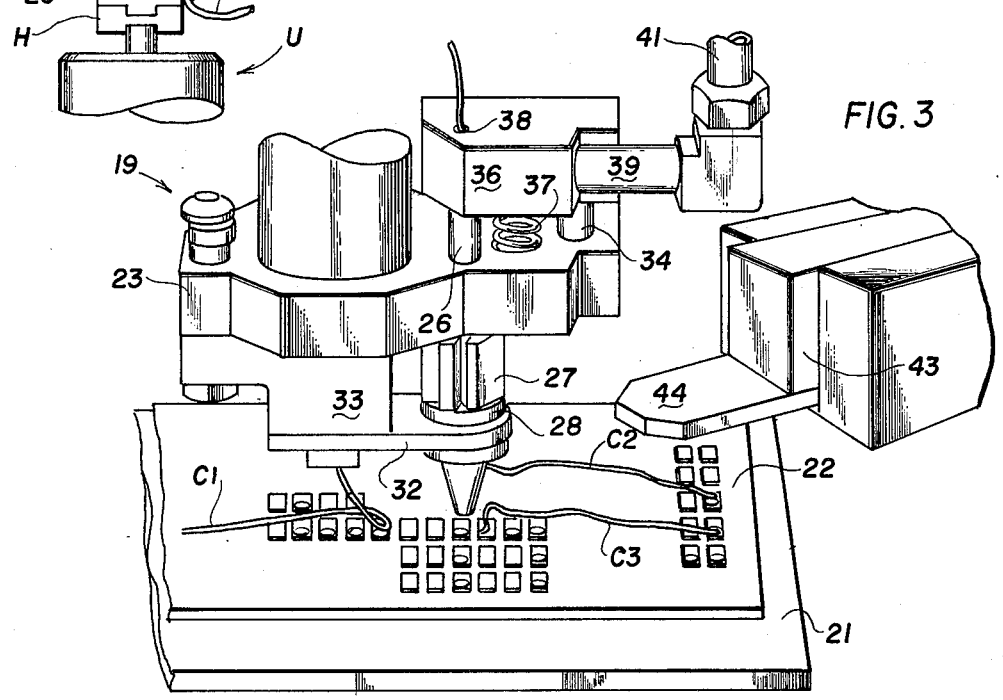
FIG. 3

CIRCUIT BOARD WIRE BONDING AND CUTTING APPARATUS

BACKGROUND OF THE INVENTION

In applying circuit wires to a printed board the art has relied upon stitch pins or terminals to receive the wire connections for the circuit. The connections are made by electrical bonding or welding, and the termination of a circuit wire has been by cutting with a separate tool having a fixed position relative to the pin, or by the use of a manually operated side cutter. The printed circuits on such boards are small and set close together so that it is sometimes a problem to clear out the end required to be cut off, and the waste of wire is significant.

At present operators of printed circuit board wiring apparatus generally bond up wires for a group of circuits and then retrace the circuit with an illuminated magnifying glass for the purpose of trimming wire ends that might cause problems. The fact that wire ends need to be trimmed means that a quantity of wire is wasted and the time needed to perform the trimming is costly. It is estimated that more than half the time needed to produce a finished printed circuit board is used up in the wire trimming operation. It is also necessary that the operator of apparatus of the type which can perform the wire stitching operation must each time before beginning a circuit manually bend the wire into a position suitable for bonding it to the initial pin in a given circuit. Uniformity of bend is not easily obtained and that leads to waste of the wire and loss of time due to the need to trim excessively long circuit wire ends.

In one arrangement for stitch bonding circuit boards, as discussed in Helda et al U.S. Pat. No. 3,400,448, issued Sept. 10, 1968, a thermal compression bond is made by feeding the circuit wire through a hollow tube so it protrudes and can be arranged to lie across the end of the tube by shears, or by vibrating the tube to sever the wire. The arrangement shown in Steranko, U.S. Pat. No. 3,673,681 issued July 4, 1972 includes circuit board wiring by electrical pulse heating which sublimates the polyurethane insulation and reflow solders the copper wire to the contact pad. The wire is then cut by a flat wire cutter which is fixed in its position at one side of the soldering tip. A different arrangement for effecting wire feed and welding in connection with circuit board terminal pins in shown by Annett, U.S. Pat. No. 3,822,373 issued July 2, 1974. In this prior art reference the wire is outside of the electrode and moves across the electrode face through spaced guides which confine the wire to a single direction of alignment across the electrode. Severing of the wire after the last pin is contacted is not discussed.

BRIEF DESCRIPTION OF THE INVENTION

The present invention pertains to improvements in circuit board wire bonding and cutting apparatus.

The objects of the present invention are to provide wire handling means that will cut the wire at the last stitch pin bond regardless of the direction of movement of the circuit board, to provide means to prepare the position of the wire for bonding to the first stitch pin of a circuit, to provide a unique arrangement of electrode and cutter in telescoping relation for rapid and positive operation, and to provide wire bending, bonding and cutting means in an arrangement suitable for use in automatic wire stitch machines.

The invention is embodied in apparatus which includes an electrode and a wire cutter in telescoping cooperation and operably movable toward and away from the circuit board stitch pins to effect a bond and to trim the wire without excessive end length, a wire bend device operable to wipe the wire over the electrode in preparation for bonding to a stitch pin, and wire feed means operative to position the wire end at the desired exposure relative to the electrode so the wire bend device is able to function properly.

The presently preferred embodiment of this invention is arranged to overcome the problem of requiring the operator to manually or otherwise bend the wire end across the face of the electrode to accomplish the initial bond in a circuit, and after completing the circuit requiring the operator to cut the wire. The usual practice has been for an operator to complete a plurality of circuits and then go back over each circuit with a magnifying glass and cut, trim and remove excessively long ends. The time consumed in this usual practice is not justified, the result of manual trimming is non uniform results, and the wire ends trimmed off is wasteful of the wire.

The advantage of the present invention over the usual practice is that the operator does not have to bend the wire to start a circuit, the proper amount of wire for bending is exposed at the electrode, means is provided for mechanically bending the wire, and the trimming operation is made universal in its ability to cut the wire regardless of its direction of approach to the stitch pin at the end of a circuit. The ability to cut the wire in every direction is especially important in view of the relative movement between circuit board and electrode.

BRIEF DESCRIPTION OF THE DRAWINGS

The presently preferred embodiment of this invention is set forth in the accompanying drawings, wherein:

FIG. 1 is an elevational view from the front of the apparatus to show the general arrangement of the operating components;

FIG. 2 is a side view of the apparatus taken along the line 2—2 in FIG. 1;

FIG. 3 is a fragmentary perspective view from the front of the apparatus showing part of a circuit board and certain circuit wires in place;

DETAILED DESCRIPTION OF THE APPARATUS

Figure 4:
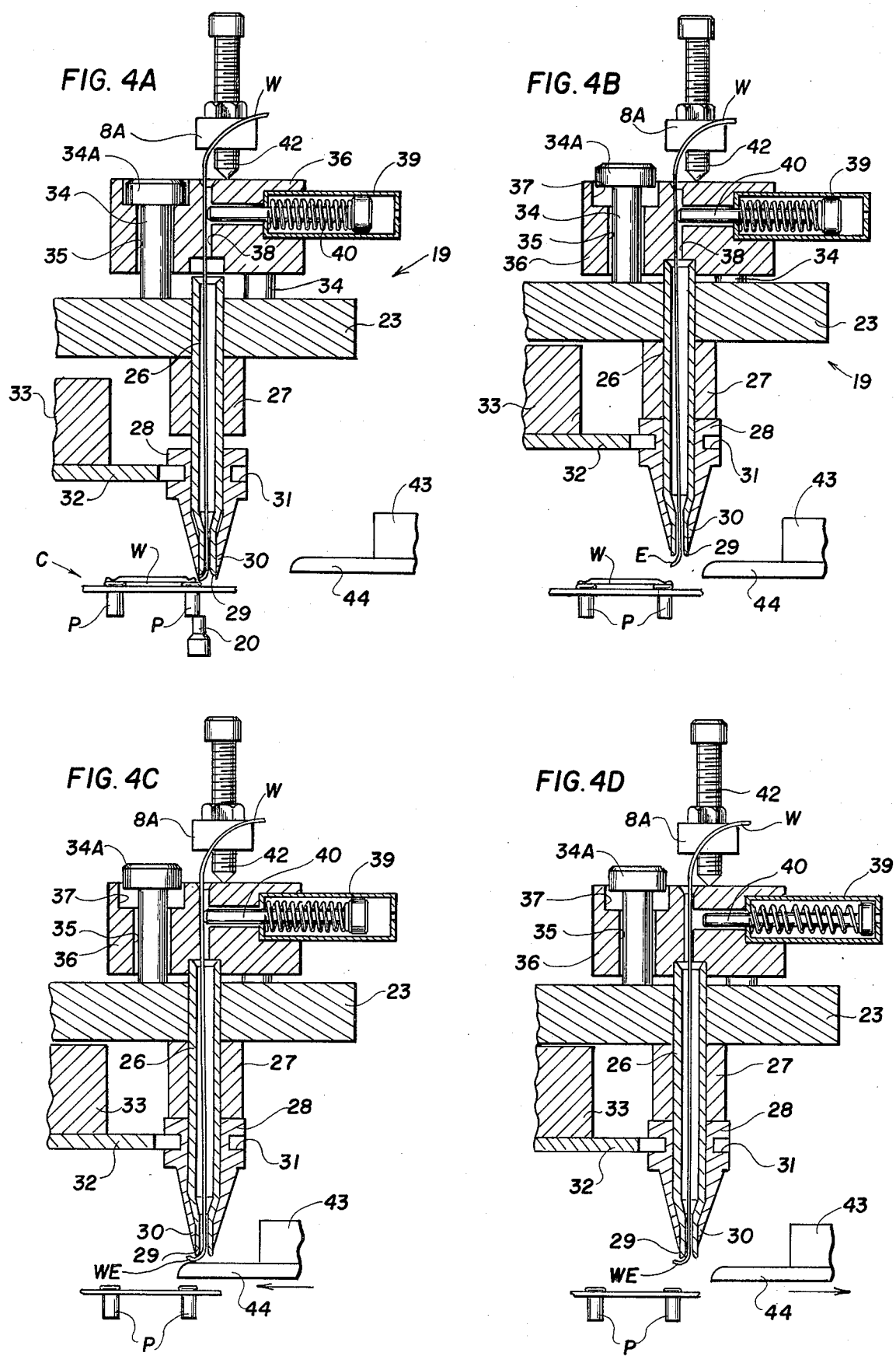
FIG. 4A is a schematic view of the operating components, partly in section, to show the positions thereof upon cutting the circuit wire at the end of a circuit.
FIG. 4B is a similar view showing the electrode and cutter head retracted and the wire extended prior to operation of the bend means in waiting position.
FIG. 4C is a similar view showing the wire bend means in its extended bend position.
FIG. 4D is a similar view showing the wire bend means retracted so the head is free to move down toward a stitch pin.

The present apparatus is shown in its simplest form to include a stationary frame 7 having a base arm 8 and an upper spaced arm 9. These arms 8 and 9 support guide rods 10 in spaced relation to provide stability and smooth travel of a carrier member 11 which is operatively mounted on the guide rods 10 through insulation bushings 11. The carrier member 11 is moved down on the guide rods 10 by a foot operated pedal 12 connected to lever 13 so the operator is able to advance the electrode when the selected stitch pin is located properly. The electrode is retracted by a spring 14 acting on lever 13. One side of the power supply for the electrode is represented by lead 15 in association with current return lead 16 which is on the ground side of the circuit. The flexible lead 16 insures that the frame 7 and carrier 11 are grounded. The carrier member 11 is connected to a drive rod 17 which extends through a bushing 18 in base arm 8 to the lower end which is connected to the welding head assembly 19 set over and aligned with a fixed lower electrode 20. The space between the welding head 19 and electrode 20 is occupied by the movable support 21 for the printed circuit board 22 (FIG. 3). The lower electrode 20 (FIG. 1) is mounted in a holder H which is raised and lowered by a cylinder and piston unit U subject to a control (not necessary to show) linked with the operation of the pedal 12. The welding power supply lead S is attached to the holder H for the electrode 20.

The welding head 19 is made up of a number of operative parts (see FIGS. 3 and 4A–4D). For example, the drive rod 17 has its lower end connected to a mounting plate 23. The plate supports a fluid pressure operated motor cylinder 24 supplied with pressure fluid through conduit 25 from a suitable source (not shown). The plate is suitably apertured to receive the upper end portion of a tubular welding electrode 26. The lower portion of electrode 26 is engaged by a clamp 27 which abuts the under side of the mounting plate 23, and a wire cutter head 28 is telescoped over the lower end 29 of the electrode 26 so that its circular or round tubular cutting edge 30 circumscribes the electrode. The cutter head 28 is formed with a recess 31 which is engaged by an operating plate 32 fastened to the piston head block 33 which is part of the motor cylinder 24. The block 33 is movable away from the mounting plate 23 upon operation of the motor cylinder 24 to drive the cutter head 28 down on the electrode 26 so its cutting edge 30 projects beyond the end 29 of the electrode for purposes of wire cutting.

The movement of the block 33 is accompanied by the motion of pins 34 sliding in bores 35 in a wire feed block 36. Each pin 34 is formed with an enlarged head 34A which on its down movement seats in a recess 37 in the wire feed block 36. One or more spring elements 37 are normally operative to maintain the wire feed block 36 raised or spaced from the mounting plate for a purpose to appear presently.

The wire feed block 36 formed with a guide hole 38 for the passage of insulated wire W into and through the hollow electrode 26. A wire clamp device comprises the cylinder 39 mounted in the block 36 so that its piston 40 may extend into the wire hole 38, when necessary, to engage the wire and press it against the side of the hole 38, when the wire W needs to be restrained or fixed in the block 36. The cylinder 39 is supplied with pressure fluid through conduit 41. The raised or home position of the block 36 is fixed by the adjusting abutment screw 42 mounted in the adjacent end 8A of the base arm 8 of frame 7. It can now be understood that there is relative (lost) motion between the mounting plate 23, and the wire feed block 36 for the following purposes: The relative motion between the cutter head 28 and the mounting plate 23 is to obtain a wire cut. The relative motion between the mounting plate 23 and the block 36 is to effect advance or feed of the wire W.

The apparatus also includes a wire bending slide 43 provided with a finger 44 in position, when the head 19 is in its raised position, to be advanced to bend the exposed end E of the wire W that protrudes beyond the end 29 of electrode 26. The slide 43 is operated by a pressure fluid motor means 45 best seen in FIG. 1. The slide 43 is operably carried in member 46 which also supports the cylinder 45.

It can be seen in FIG. 3 that the weld head 19 is situated over a printed circuit board 22 carried on support 21. While not shown, the support 21 is moved relative the weld head 19 so that the circuit stitch pins P located in the board 22 can be positioned in alignment between the electrode end 29 and the cooperating electrode 20 disposed beneath the board 22. A number of circuit connections are shown completed at C1, C2, and C3.

Turning to the sequence of operations of the apparatus as seen in FIGS. 4A–4D, and keeping in mind the relative movements of the several components, the view of FIG. 4A illustrates the cutting of the wire W after welding to the last stitch pin P of a circuit C. In this view, the printed circuit board has been moved so that the area of the weld is not in line with the electrode, but the cutter edge 30 is lined up to make a cut against the stitch pin head. The motor cylinder 24 can now be energized to move the piston head block 33 and its operating plate 32 down in a direction to advance the cutter head 28 so the cutting edge 30 extends beyond the electrode 29 a distance sufficient to sever the wire without damage to the head of the stitch pin P. The motor cylinder 24 is reversed to retract the cutter head 28 and withdraw the cutting edge 30 so the electrode end 29 is exposed. Concurrently the carrier member 11 is raised by sliding upwardly on the guides 10. This action draws the rod 17 up through the bottom arm 8 of the frame 7 and the mounting plate 23 is returned to its up position. On the down cutting stroke of the motor cylinder 24, the wire grip cylinder 39 is energized to advance the piston 40 for clamping the wire W in the hole 38 in the wire feed block 36. The up movement of the carrier member 11 raises the wire feed block 36 due to the positioning of the coil spring 37 between the mounting plate 23 and the block 36. The block 36 is arrested in its up movement by the abutment screw 42. The amount of lost motion selected for the mounting plate 23 relative to the wire feed block is necessary to effect feeding of the wire W beyond the end 29 of the electrode 26. Thus the wire feed for the next circuit weld is seen in FIG. 4B.

As seen in FIG. 4C the protruding end WE of wire W is located at the elevation where the wire bending finger 44 can be advanced by its slide 43 to wipe the wire end WE into a bend to one side of the electrode end 29. Upon retraction of the finger 44, as in FIG. 4D, the welding head is ready to be advanced toward a stitch pin P which has been properly positioned by movement of the printed circuit board 22 on its support 21. The cycle of events above described is repeated, except that the cylinder 39 is deenergized to withdraw the piston 40 to release its grip on the wire. When released the wire W is drawn forward by its bent end WE FIG. 4D as the mounting member 23 is moved down by the carrier member 14 so the end 29 of the electrode 26 is brought into welding contact through the wire end WE with the stitch pin P.

Figure 6:
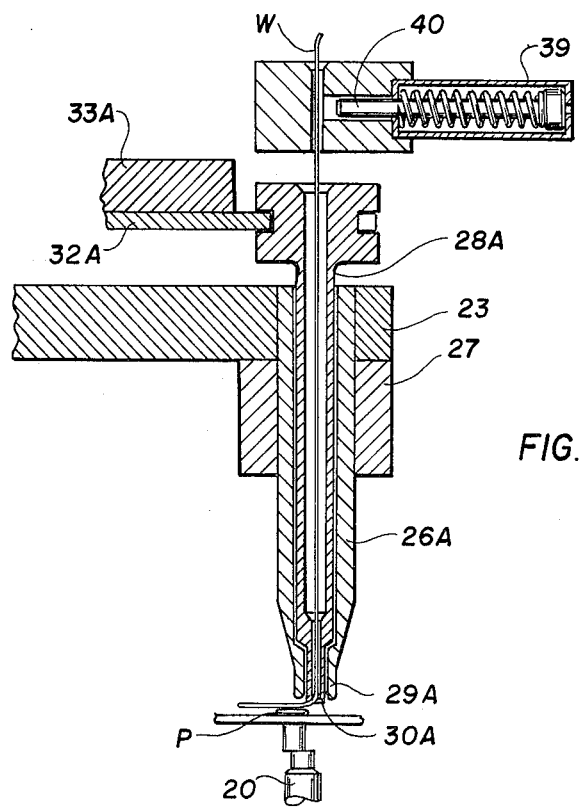
FIG. 6 is a fragmentary sectional view of a modified electrode and cutter.

The modified electrode 26A and wire cutter 28A shown in FIG. 6 is a relocation of these parts so the cutter 28A is connectrically inside the tubular electrode 26A so its cutting end 30A is inside the electrode end 29A. The wire W extends through the cutter 28A.

An important and unique feature of the invention resides in the provision of tubular electrodes and wire cutters arranged in telescoping relation so the electrode and cutter are able to function in any direction to effect a weld and to make a neat cut so that end trimming of the wire is accomplished with no waste. In other words, the weld and the wire cut can be made for every direction of movement found necessary to make a circuit without interfering with stitch pins or other circuits. (See FIG. 3).

It has been disclosed that after the wire has been cut at the end of a given circuit, the wire in the hollow member is firmly held. Now when the electrode is retracted to its up position, the wire feed is activated to advance the wire W about 0.050 to 0.060 beyond the weld tip of the electrode 29 or 29A where the wire bend finger can be used to form a 90° bend in the exposed end.

Figure 5:
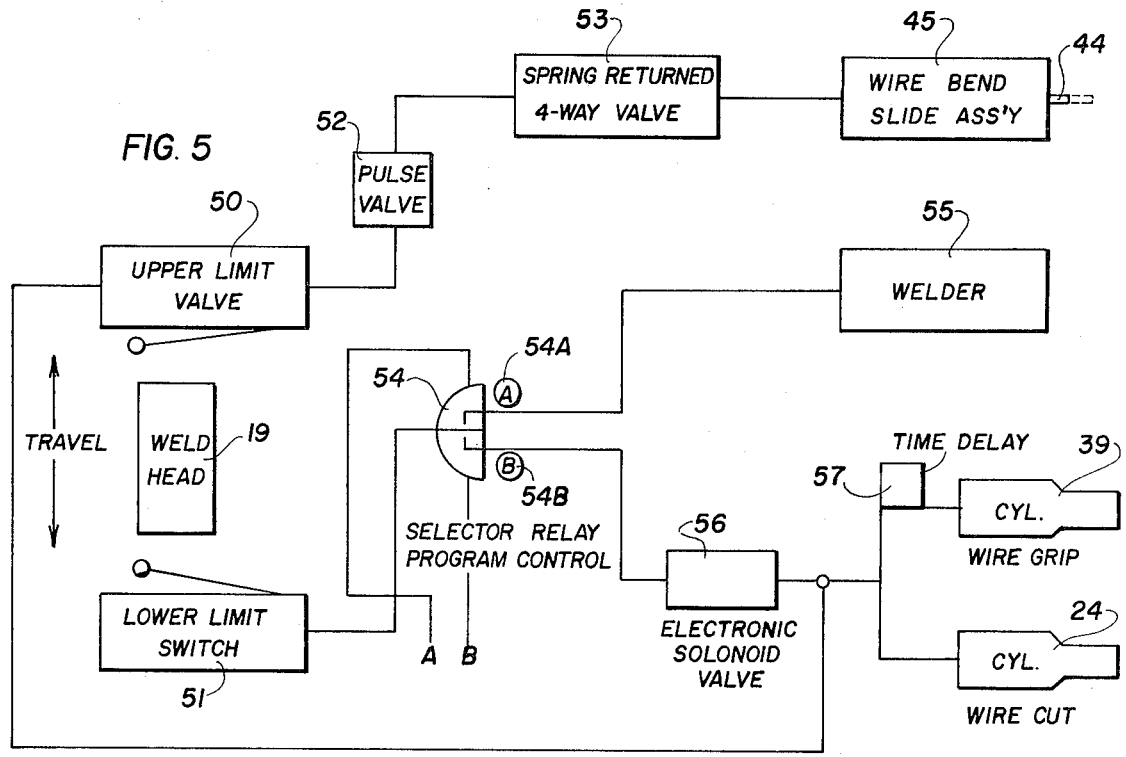
FIG. 5 is a block diagram of a control circuit for the apparatus of this embodiment.

Turning now to FIG. 5 there is disclosed a block diagram of a suitable control system for the apparatus above-described. It can be seen that the welding head 19 is movable between a raised or home position limit valve 50 and a down position limit switch 51. When the welding head 19 is in its home position it operates valve 50 which sends a signal through a pulse valve 52, and that in turn sends a signal to a four-way valve 53 for operating the motor cylinder 45 to effect a wire bend operation by extending the bending finger 44 to bend the protruding end of the circuit wire by wiping it across the end 29 of the welding head electrode. The pulse valve 52 after a time span cancels the signal to the four-way valve 53 to retract the finger 44 by deenergizing the motor cylinder 45. When the welding head 19 moves down it actuates limit switch 51 to send a signal to the selector relay 54. When the selector relay 54 is in the position 54A a signal is sent to connect the source of welding current from means 55 to the electrode 20, and that causes the circuit wire W to be welded to the stitch pin P as above-described.

When the selector relay 54 is in the position 54B a signal is directed to the electronic solonoid valve 56. The valve 56 supplies air pressure from a suitable source through a time delay device 57 to actuate the cylinder 39 which causes the piston 40 to extend and grip the wire W in the passage 38 of the wire feed block 36.

At the same time the electronic solonoid valve 56 sends a signal to the motor cylinder 24 for actuating the wire cutter 28, causing it to extend the cutter 30 for severing the circuit wire W adjacent the point of welding attachment to the stitch pin P. When the welding head 19 again moves to its home position the limit stitch 51 cancels signals to the selector relay and this causes the wire cutter motor cylinder 24 to retract, but the cylinder 39 remains energized during the time interval controlled by the time delay device 57. The time interval is selected to allow operation of the motor cylinder 45 for extending the wire bending finger 44.

It should now be understood that the motion of the welding head 19 serves to generate the above-described operating signals for effecting the bending of the wire across the end of the welding electrode, and energizing the current source for causing the wire to be welded to a stitch pin, as well as operating the wire cut-off cylinder 24 and the wire gripping cylinder 39. The selector relay 54 is movable between its positions 54A and 54B, either by an operator who is able to observe the movement of the support 21 which carries the printing circuit board 22, or the selector relay 54 is controlled by a pre-programmed tape which renders the present apparatus automatic in it operation. Tape control systems are well known and it is not believed necessary to disclose the same other than to point out that the selector relay may be governed by a pre-programmed tape, and the programed tape can be such that it will complete the required number of circuits on the printing circuit board 22 before ending the operation of the various components. For example, the selector relay 54 may be provided with leads A and B for connection to a tape reader or for connection to an operator control.

What is claimed is:

1. Wire bonding and cutting apparatus for establishing wire circuits to several terminals in a printed circuit board, said apparatus comprising: a hollow electrode having an end engageable with the circuit board terminals; a supply of circuit wire extending through said hollow electrode and protruding from said electrode end; means adjacent said electrode end and operable to wipe across the electrode end and bend the protruding wire at least into a 90° bent position; means operable to advance said electrode and bent wire into contact with a first one of the circuit board terminals to weld the wire to start a circuit and to weld another portion of the wire to at least one other terminal; tubular cutter means telescopically related to said electrode and having a cutter end adjacent said electrode end; and means operably connected to said tubular cutter to move the tubular cutter relative to said electrode and advance said cutter end into wire cutting position beyond said electrode end at the one other terminal to end the circuit.

2. The apparatus set forth in claim 1 wherein; said tubular cutter surrounds said electrode adjacent said electrode end.

3. The apparatus set forth in claim 1 wherein; said electrode end is circular for welding circuit wire in any position through 360° of arc.

4. The apparatus set forth in claim 1 wherein; said electrode end is circular for welding circuit wire in any position through 360° of arc.

5. The apparatus set forth in claim 1 wherein; said tubular cutter end is circular for cutting wire in any position through 360° of arc.

6. The apparatus set forth in claim 1 wherein; said means operable to advance said electrode and bent wire and said means operably connected to said tubular cutter are movable relative to each other.

7. Apparatus for welding a continuous circuit wire to stitch pins of a printed circuit board comprising: a relatively fixed circuit welding electrode in position to be engaged by the stitch pins of the circuit board; a movable electrode having an axis of motion substantially aligned with said fixed electrode and having an end engageable with the stitch pins for welding the circuit wire to the stitch pins, a welding circuit being made between said substantially aligned fixed and movable electrodes with the circuit wire and stitch pins therebetween; wire feed means adjacent said movable electrode and operable to move with and relative to said movable electrode; and circuit wire cutter means adjacent said movable electrode and having a cutting end movable relative to said electrode end into wire ctting position at the end of a wire circuit connecting at least two stitch pins, said cutting end of said cutter means having a circular cutting edge movable toward a stitch pin located between said fixed and movable electrodes, said cutting edge presenting a portion thereof in position operable for cutting the circuit wire independently of the angular alignment of the circuit wire at said aligned stitch pin, said cutting edge portion of said cutter means severing the circuit wire against said stitch pin.

8. The apparatus set forth in claim 7, wherein said movable electrode and said cutter means are telescopically related.

9. The apparatus set forth in claim 7, wherein said movable electrode is hollow to accept circuit wire from said wire feed means, and said cutter means is hollow and telescope over said movable electrode.

10. The apparatus set forth in claim 7, wherein said cutter means is hollow to accept circuit wire from said wire feed means, and said movable electrode telescopes over said cutter means.

11. The apparatus set forth in claim 7, wherein said electrode end is circular for welding circuit wire in any position through 360° of arc.

12. The apparatus set forth in claim 7, wherein said movable electrode has a home position in which its end for welding is spaced from the circuit board stitch pins, said wire feed means directs the wire through said movable electrode welding end, and wire bending means is positioned adjacent said electrode home position and is operable for bending the circuit wire protruding from said electrode end.

* * * * *